United States Patent
Neumann (10) Patent No.: US 7,821,785 B1
(45) Date of Patent: Oct. 26, 2010

(54) HEATSINKS AND A SPRING IN A BAFFLE SLOT BETWEEN ADJACENT COMPONENTS

(75) Inventor: Matthew D. Neumann, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 25 days.

(21) Appl. No.: 12/426,863

(22) Filed: Apr. 20, 2009

(51) Int. Cl.
H05K 7/20 (2006.01)

(52) U.S. Cl. .............. 361/679.47; 361/679.49; 361/679.51; 361/679.54; 361/704; 361/709; 361/715; 361/716; 361/719; 174/16.3; 257/707; 257/717; 257/719; 257/720; 257/726; 257/712; 257/713; 165/80.3; 165/104.33; 165/185

(58) Field of Classification Search .................. 361/679.46–679.54, 688–697, 704, 707, 361/709–712, 715–724, 730; 174/15.1, 16.3, 174/252; 257/706–727; 62/259.2; 165/80.2, 165/80.3, 80.4, 80.5, 104.33, 104.34, 104.21, 165/185

See application file for complete search history.

(56) References Cited

U.S. PATENT DOCUMENTS

| | | | | |
|---|---|---|---|---|
| 6,319,756 B2 * | 11/2001 | Duesman et al. | ............ | 438/122 |
| 6,496,375 B2 * | 12/2002 | Patel et al. | .................. | 361/719 |
| 6,775,139 B2 * | 8/2004 | Hsueh | ......................... | 361/697 |
| 7,023,701 B2 | 4/2006 | Stocken et al. | | |
| 7,257,002 B2 * | 8/2007 | Nagahashi | .................. | 361/704 |
| 7,289,331 B2 | 10/2007 | Foster, Sr. et al. | | |
| 7,339,793 B2 | 3/2008 | Foster, Sr. et al. | | |
| 7,342,797 B2 | 3/2008 | Kamath et al. | | |
| 7,365,990 B2 * | 4/2008 | RaghuRam | ................. | 361/720 |
| 7,446,410 B2 * | 11/2008 | Wehrly et al. | ............... | 257/707 |
| 7,471,514 B2 * | 12/2008 | Chen | ......................... | 361/695 |
| 7,643,300 B1 * | 1/2010 | Zheng et al. | ................. | 361/716 |
| 7,660,114 B2 * | 2/2010 | Watanabe et al. | ........... | 361/690 |
| 7,679,913 B2 * | 3/2010 | Hsieh | ......................... | 361/704 |
| 2006/0221573 A1 * | 10/2006 | Li | .............................. | 361/704 |
| 2009/0251857 A1 * | 10/2009 | Legen et al. | ................. | 361/689 |

* cited by examiner

*Primary Examiner*—Michael V Datskovskiy
(74) *Attorney, Agent, or Firm*—David A. Plettner (57) ABSTRACT

A baffle has a slot, with the slot positioned between first and second adjacent components when the baffle is installed above the components. A pair of heatsinks are inserted into the slot, with at least one heatsink having a heat dissipating portion that remains above the slot after insertion into the slot. A spring is inserted into the slot between the pair of heatsinks.

20 Claims, 10 Drawing Sheets

HEATSINKS AND A SPRING IN A BAFFLE SLOT BETWEEN ADJACENT COMPONENTS

BACKGROUND

In the art of computing, component densities continue to increase. Furthermore, in data centers there is a desire to provide as much computing power as possible per unit of data center floor space, leading to high density packaging at the component level, the system level, and the rack level. At the component and system levels, it is desirable to position memory modules as close as possible, while maintaining adequate cooling. As memory density increases, thermal management of memory modules becomes increasingly more important.

BRIEF DESCRIPTION OF THE DRAWINGS

The Figures depict embodiments, implementations, and configurations of the invention, and not the invention itself.

DETAILED DESCRIPTION

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

Embodiments of the present invention relate to pairs of heatsinks that are inserted between corresponding pairs of memory modules. A memory baffle is installed above the memory modules, with the memory baffle having slots aligned with gaps between pairs of memory modules. A pair of heatsinks are inserted into each slot, and a spring is inserted between each pair of heatsinks to urge the heatsinks into thermal contact with components or heat spreaders on the memory module.

Figure 1:
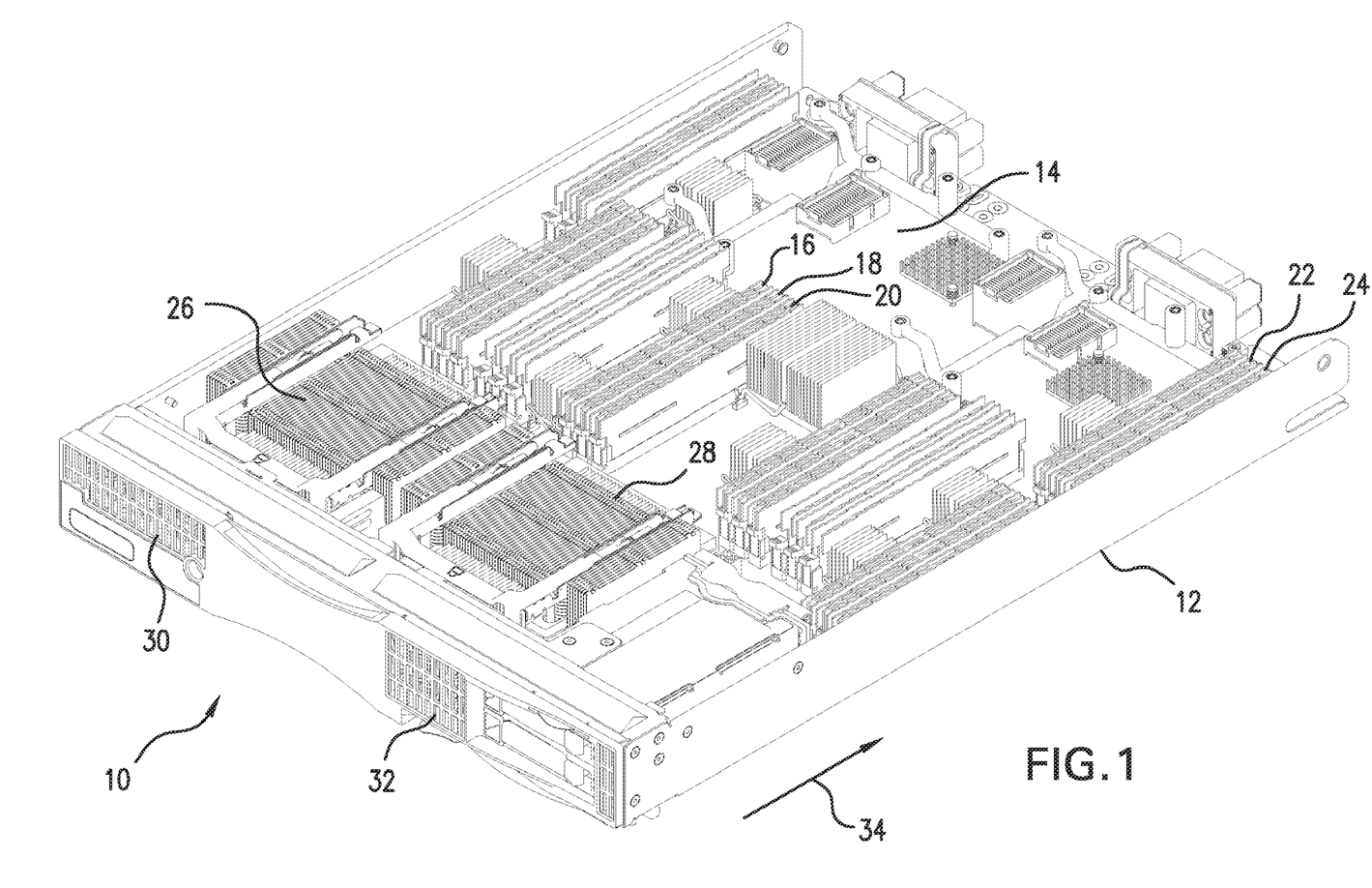
FIG. 1 is a perspective view showing an exemplary computer system in which embodiments of the present invention may be deployed.

FIG. 1 is a perspective view showing an exemplary computer system 10 in which embodiments of the present invention may be deployed. Those skilled in the art will recognize that computer system 10 is merely representative, and other computer systems may be used. Furthermore, although embodiments of the present invention will be described with reference to a computer system, embodiments of the present invention may be deployed in other types of electronic devices.

Computer system 10 is housed in enclosure 12 and includes motherboard 14. As is known in the art, motherboard 14 is a circuit board. Located on motherboard 14 are memory modules, such as memory modules 16, 18, 20, 22, and 24. Note that pairs of memory modules are adjacent and parallel to each other. Also located on motherboard 14 are processors 26 and 28. As shown in FIG. 1 and other figures, heatsinks are attached to the processors. Computer system 10 includes other components, such as integrated circuits, voltage regulators, and other components known in the art. Further discussion of these components is not necessary to facilitate an understanding of embodiments of the present invention.

Vents 30 and 32 are provided on the front of enclosure 12. In the embodiment shown in FIG. 1, computer system 10 is a blade server, and computer system 10 is configured to be installed in a blade enclosure. The blade enclosure includes cooling fans and a plenum shared by multiple blade servers. The cooling fans and plenum create airflow in the direction of arrow 34, with air entering vents 30 and 32 and leaving enclosure 12 at the rear of enclosure 12. Of course, those skilled in the art will recognize that airflow may be created using other methods, such as providing cooling fans in computer system 10.

Figure 2:
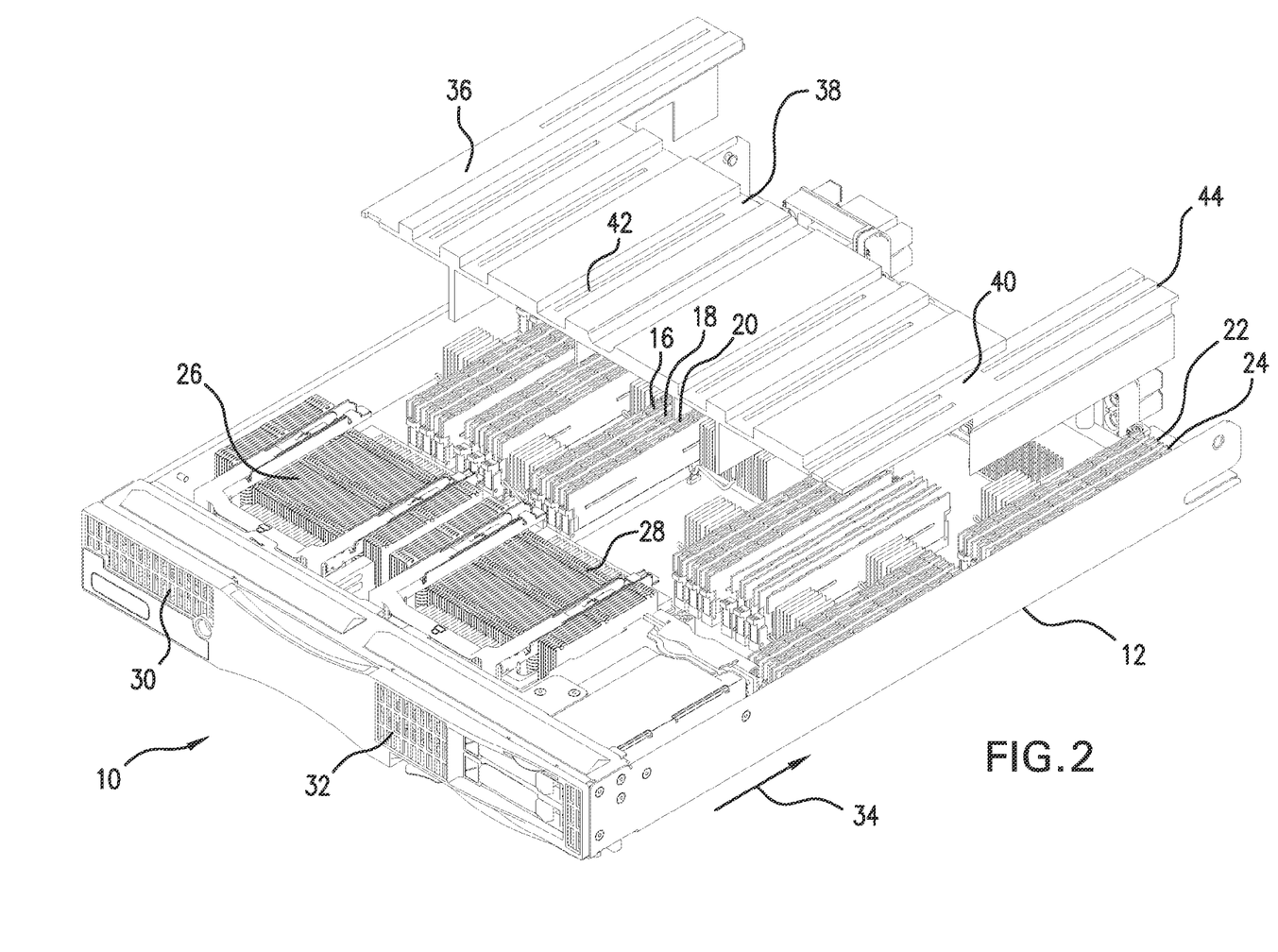
FIG. 2 is a perspective view showing the computer system of FIG. 1, along with a memory baffle, which is shown before being installed into a final position, in accordance with embodiments of the present invention.

FIG. 2 is a perspective view showing computer system 10 of FIG. 1, along with memory baffle 36, which is shown above the memory modules before being installed into a final position, in accordance with embodiments of the present invention. Memory baffle 36 includes a series of air channels, such as air channels 38 and 40. Note that the air channels are parallel to the direction of airflow shown by arrow 34. Each air channel includes one or more slots, such as slots 42 and 44. After air baffle 36 is installed into its final position, slot 42 will be positioned midway between memory modules 16 and 18, and slot 44 will be positioned midway between memory modules 22 and 24.

Figure 3:
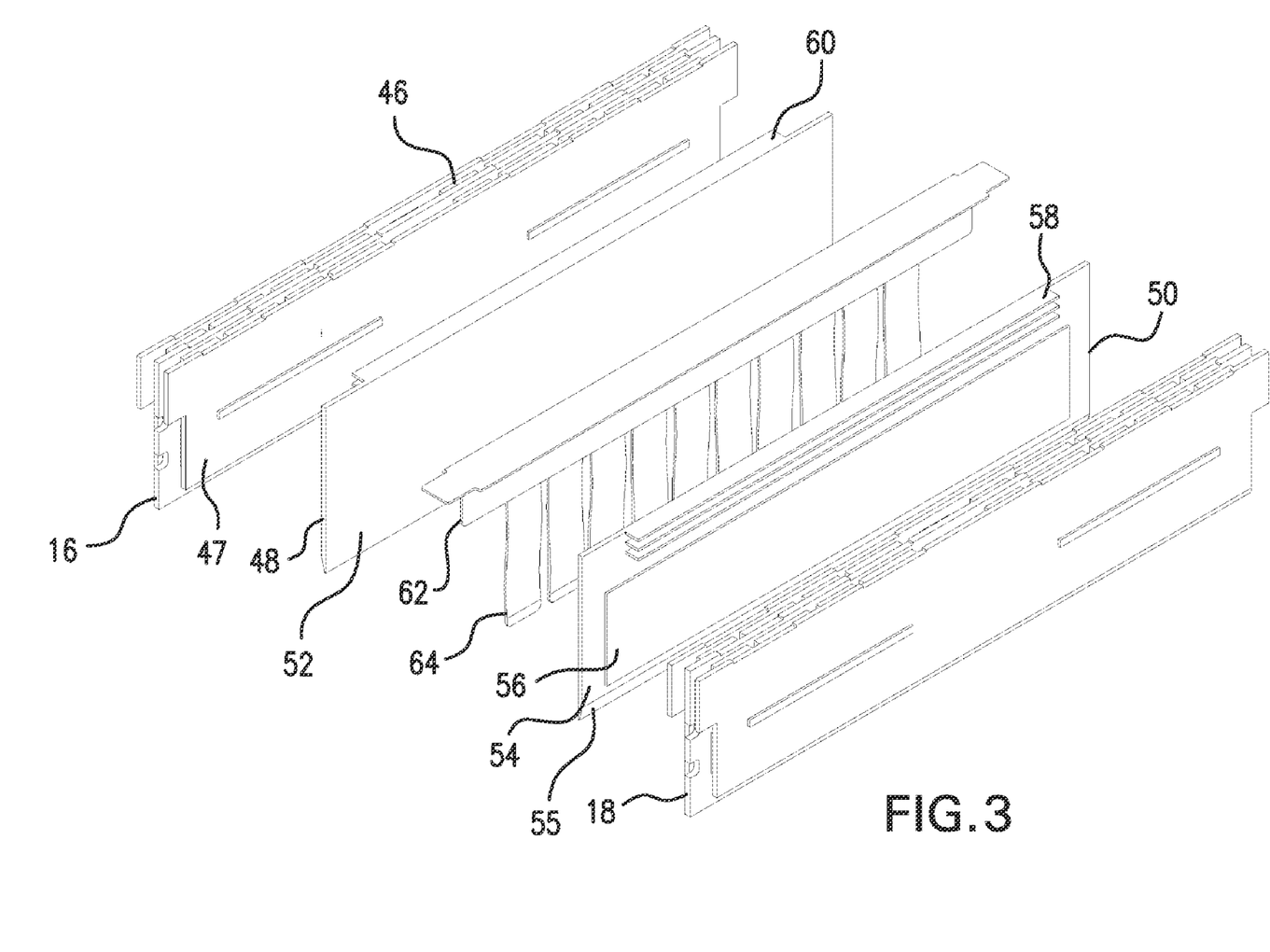
FIG. 3 is a perspective view showing memory modules, heatsinks, and a spring, in accordance with embodiments of the present invention.

FIG. 3 is a perspective view showing several components used with embodiments of the present invention. In FIG. 3, memory modules 16 and 18 from FIGS. 1 and 2 are shown. Each memory module has a plurality of memory integrated circuits on each side, such as memory integrated circuit 46 on memory module 16. Positioned over the memory integrated circuits are heat spreaders, such as heat spreader 47 of memory module 16. The heat spreaders distribute and dissipate heat generated by the memory integrated circuits. Those skilled in the art will recognize that memory modules without heat spreaders may be used with embodiments of the present invention.

Also shown in FIG. 3 are heatsinks 48 and 50, and spring 62. Each heatsink has a memory side and a spring side. As shown in FIG. 3, heatsink 50 has memory side 54 and heatsink 48 has spring side 52. Note that the bottom of each heatsink has a beveled edge to aid insertion, such as beveled edge 55 of heatsink 50. Also note that the top of each heatsink includes a portion to aid in dissipating heat. As shown in FIG. 3, heatsink 50 has fins 58, and heatsink 48 has fins 60. Furthermore, each memory side includes thermal interface material, such as thermal interface material 56 of heatsink 50. Spring 62 includes a series of "S" shaped fingers, such as "S" shaped finger 64.

Thermal interface material 56 may be any appropriate thermal interface material known in the art. One suitable thermal interface material is Thermally Conductive Interface Pad 5591S manufactured by 3M™, which comprises an outer polyester film and an inner silicone elastomer. In one embodiment, the thermal interface material has an uncompressed thickness of 0.5 millimeters.

Figure 4:
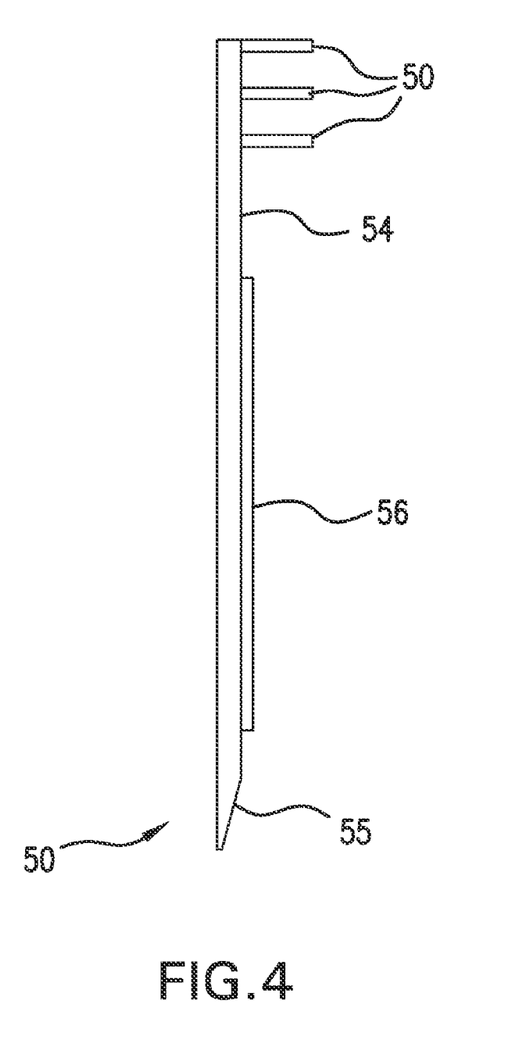
FIG. 4 is a side view of a heatsink shown in FIG. 3, in accordance with embodiments of the present invention.

FIG. 4 is a side view of heatsink 50 of FIG. 3. Heatsinks in accordance with embodiments of the present invention may be formed from any thermally conductive material, such as copper. Alternatively, the heatsinks may use a vapor mechanism to facilitate heat dissipation. One suitable product is a NanoSpreader™, which is a product of Celsia Technologies. A NanoSpreader™ is a copper encased two-phase vapor chamber into which a liquid, such as water, is vacuum sealed. The liquid is absorbed by a copper-mesh wick, evaporated to provide cooling, and passed as a vapor through a micro-perforated copper sheet, where it cools, condenses, and returns as liquid to the wick. NanoSpreaders™ can be manufactured with a thickness as thin as 1.0 millimeters, which is an ideal thickness for use with embodiments of the present invention. In one embodiment heatsinks 48 and 50, may be formed using NanoSpreaders™, with fins 60 and 58, respectively, attached to NanoSpreader™ using a bonding method, such as soldering.

Figure 5:
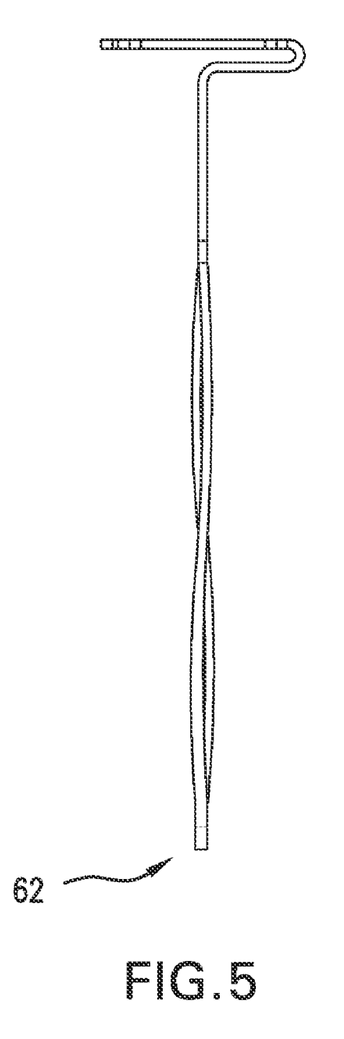
FIG. 5 is a side view of a spring shown in FIG. 3, in accordance with embodiments of the present invention.

FIG. 5 is a side view of spring 62. In FIG. 5, the "S" shape of the "S" shaped figures is apparent. In one embodiment, spring 62 is fabricated using American Iron and Steel Institute (AISI) 302 stainless steel. Those skilled in the art will recognize that other materials may be used.

In one embodiment, spring 62 has an uncompressed thickness of 0.948 millimeters, and is compressible to approximately 0.4-0.5 millimeters. The leading (bottom) edge of spring 62 is 0.4 millimeters, the separation between memory modules is 3.54 millimeters, the heatsinks are 1.0 millimeters thick, and the thermal interface material is 0.5 millimeters thick (uncompressed). Accordingly, the uncompressed thickness of two heatsinks having thermal interface material is 3.0 millimeters. After the heatsinks having thermal interface material are installed in a slot and manually urged in opposite directions, a gap of 0.54 millimeters remains between the heatsinks, which is wide enough to accommodate insertion of the 0.4 millimeter thick leading edge of spring 62. After spring 62 is fully inserted, the thermal interface material and the spring are collectively compressed by 0.408 millimeters. Of course, those skilled in the art will recognize that other dimensions may be used. For example, a wider gap between memory modules can be accommodated by thicker heatsinks or a thicker spring.

Figure 6:
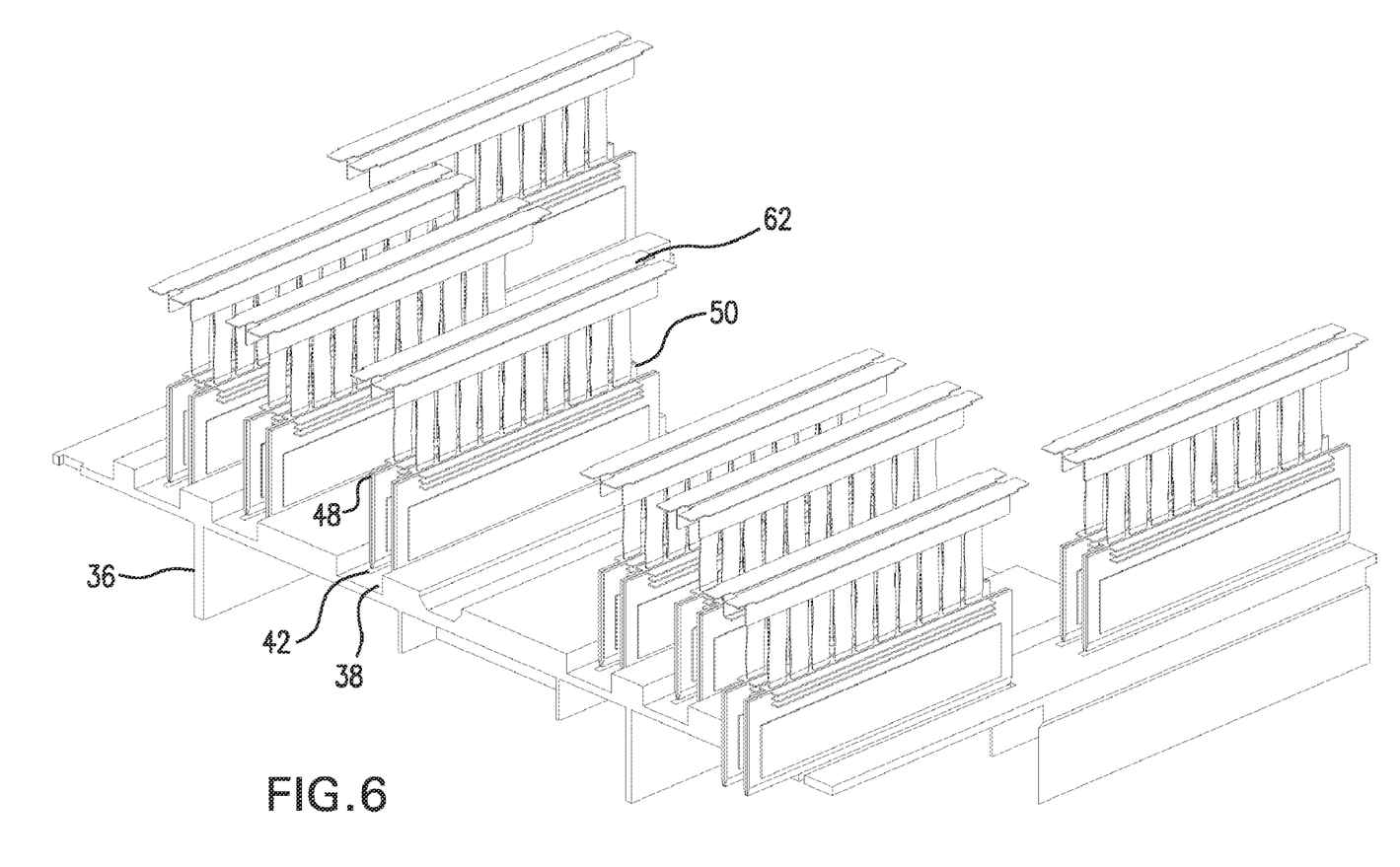
FIG. 6 is a perspective view showing the memory baffle shown in FIG. 2 along with heatsinks and springs, as shown in FIG. 3, in accordance with embodiments of the present invention.

FIG. 6 is a perspective view showing memory baffle 36 of FIG. 2 along with heatsinks and springs, as shown in FIG. 3. In FIG. 6, a pair of heatsinks are positioned above each slot, and a spring is shown above each pair of heatsinks. For example, heatsinks 48 and 50 are shown above slot 42 in air channel 38, and spring 62 is shown above heatsinks 48 and 50.

Figure 7:
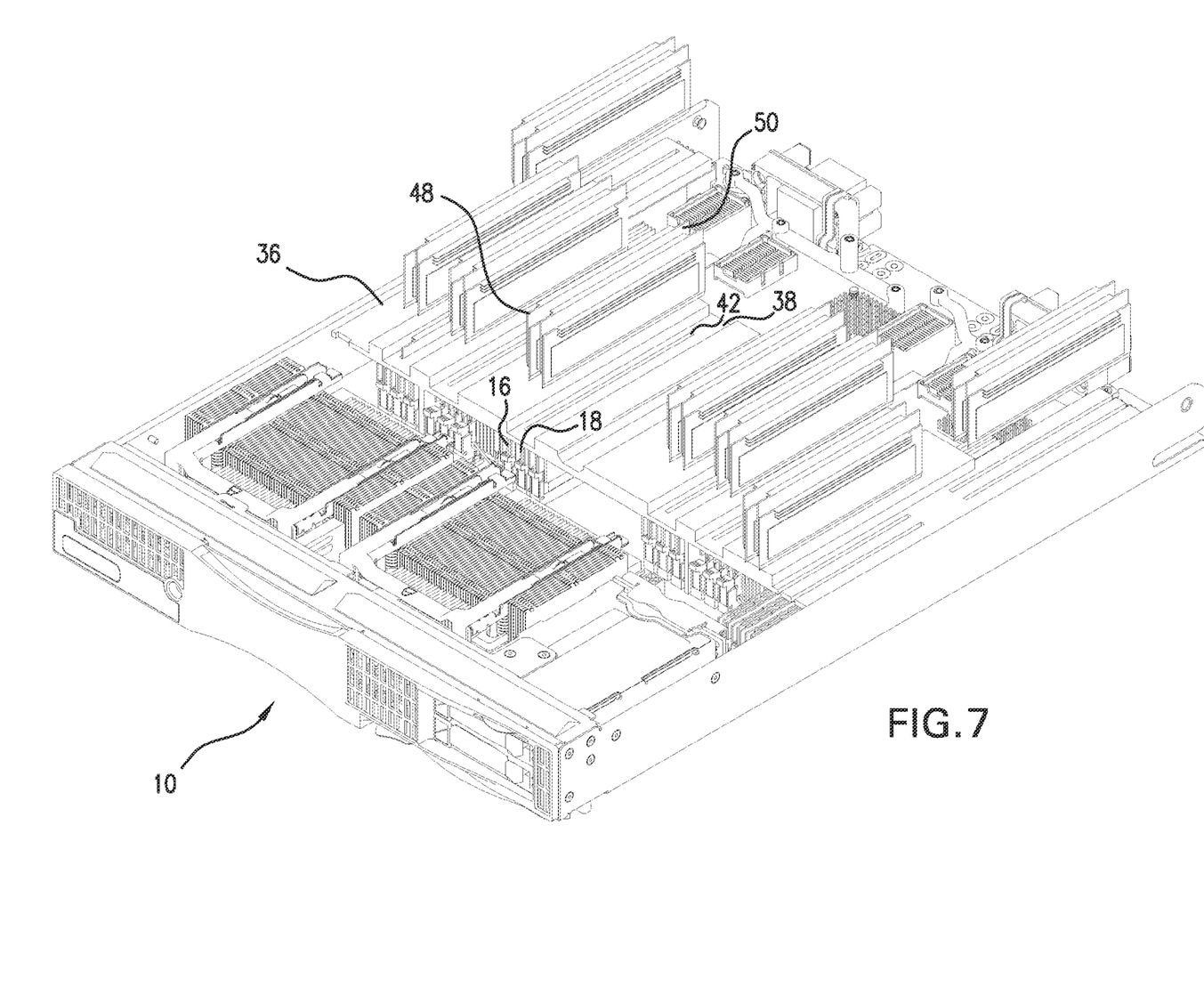
FIG. 7 is a perspective view of the computer system of FIG. 2 before heatsinks have been inserted into slots of the memory baffle, in accordance with embodiments of the present invention.

FIG. 7 is a perspective view of computer system 10 before the heatsinks have been inserted into the slots of memory baffle 36. In FIG. 2, memory baffle 36 is shown above computer system 10, and in FIG. 7, memory baffle 36 has been installed in computer system 10. Also shown in FIG. 7 are a pair of heatsinks above each slot of memory baffle 36. For example, heatsinks 48 and 50 are shown above slot 42 in air channel 38.

To install the heatsinks, each pair of heatsinks is pushed downward into a slot, and therefore into a gap between a pair of memory modules. The beveled edges of the heatsinks help guide the heatsinks into the slots and assist in positioning the heatsinks between the memory modules. Also note that baffle 36 prevents the heatsinks from being inserted too far and making contact with the motherboard.

Figure 8:
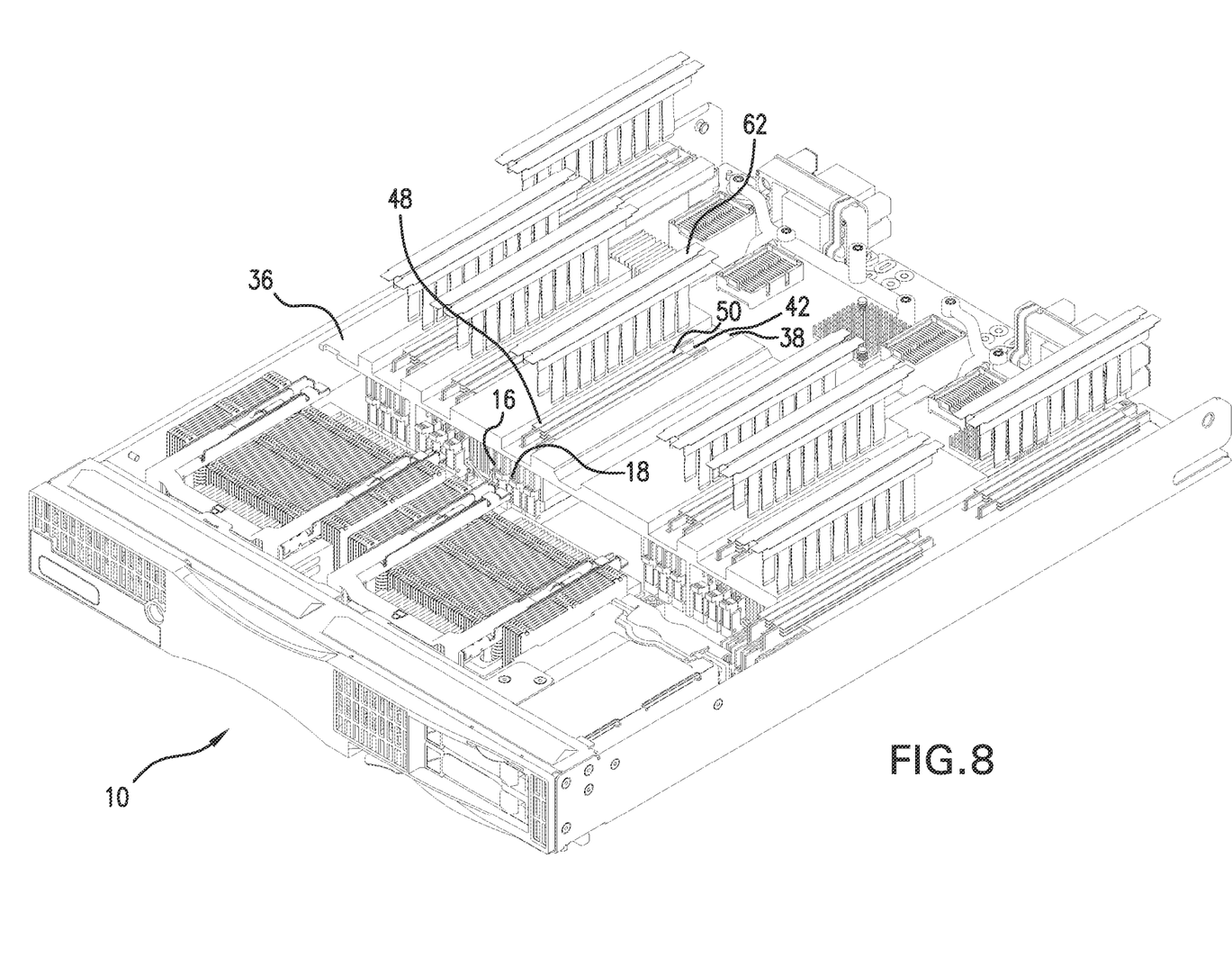
FIG. 8 is a perspective view of the computer system of FIG. 7 after the heatsinks have been inserted into the slots the memory baffle, but before the springs have been inserted between the slots, in accordance with embodiments of the present invention.

FIG. 8 is a perspective view of computer system 10 after the heatsinks have been inserted into the slots, but before the springs have been inserted into the slots and between the heatsinks. For example, heatsinks 48 and 50 have been inserted into slot 42 in air channel 38 of memory baffle 36. Accordingly, heatsinks 48 and 50 are between memory modules 16 and 18. Furthermore, spring 62 is shown positioned above heatsinks 48 and 50 prior to insertion between heatsinks 48 and 50.

Figure 9:
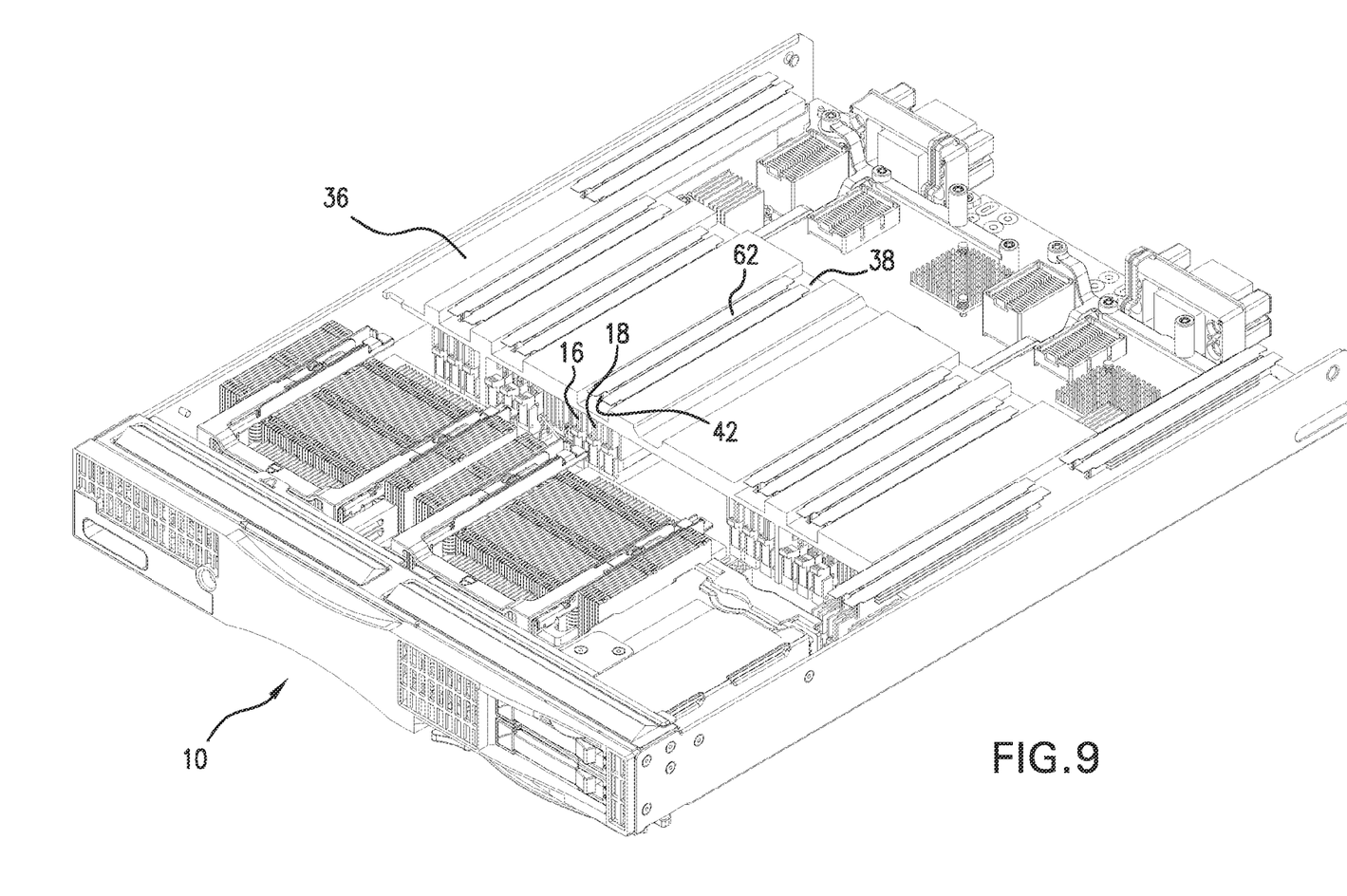
FIG. 9 is a perspective view of the computer system of FIG. 8 after the heatsinks and springs have been installed, in accordance with embodiments of the present invention.

FIG. 9 is a perspective view of computer system 10 after embodiments of the present invention have been installed. Accordingly, pairs of heatsinks have been inserted into each slot, and a spring has been inserted between each pair of heatsinks, thereby urging each heatsink into thermal contact with the heat spreader on each memory module. For example, spring 62 has been inserted into slot 42 of air channel 38 of memory baffle 36. Spring 62 urges heatsink 48 (as shown in FIG. 8) into thermal contact with the heat spreader of memory module 16 and urges heatsink 50 (as shown in FIG. 8) into thermal contact with the heat spreader of memory module 18.

Figure 10:
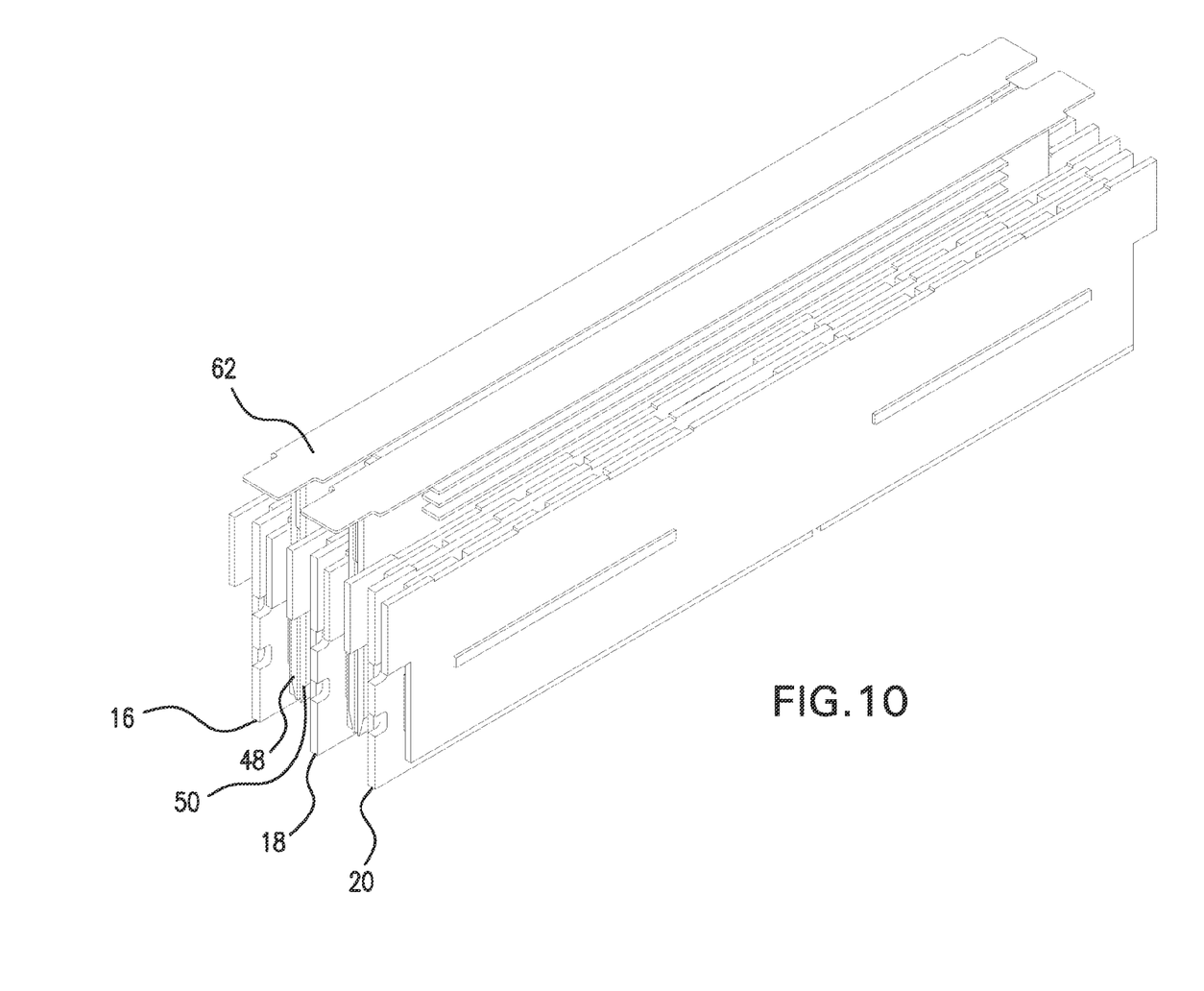
FIG. 10 shows memory modules after heatsinks and springs have been installed, in accordance with embodiments of the present invention.

FIG. 10 is a perspective view showing memory modules 16, 18, and 20 after the heatsinks and springs have been installed. To show more clearly the heatsinks in thermal contact with the memory modules, memory baffle 36 and the remainder of computer system 10 are not shown in FIG. 10. As shown in FIG. 10, heatsink 48 is in thermal contact with the heat spreader of memory module 16, and heatsink 50 is in thermal contact with the heat spreader of memory module 18, with spring 62 inserted between heatsinks 48 and 50.

Figure 11:
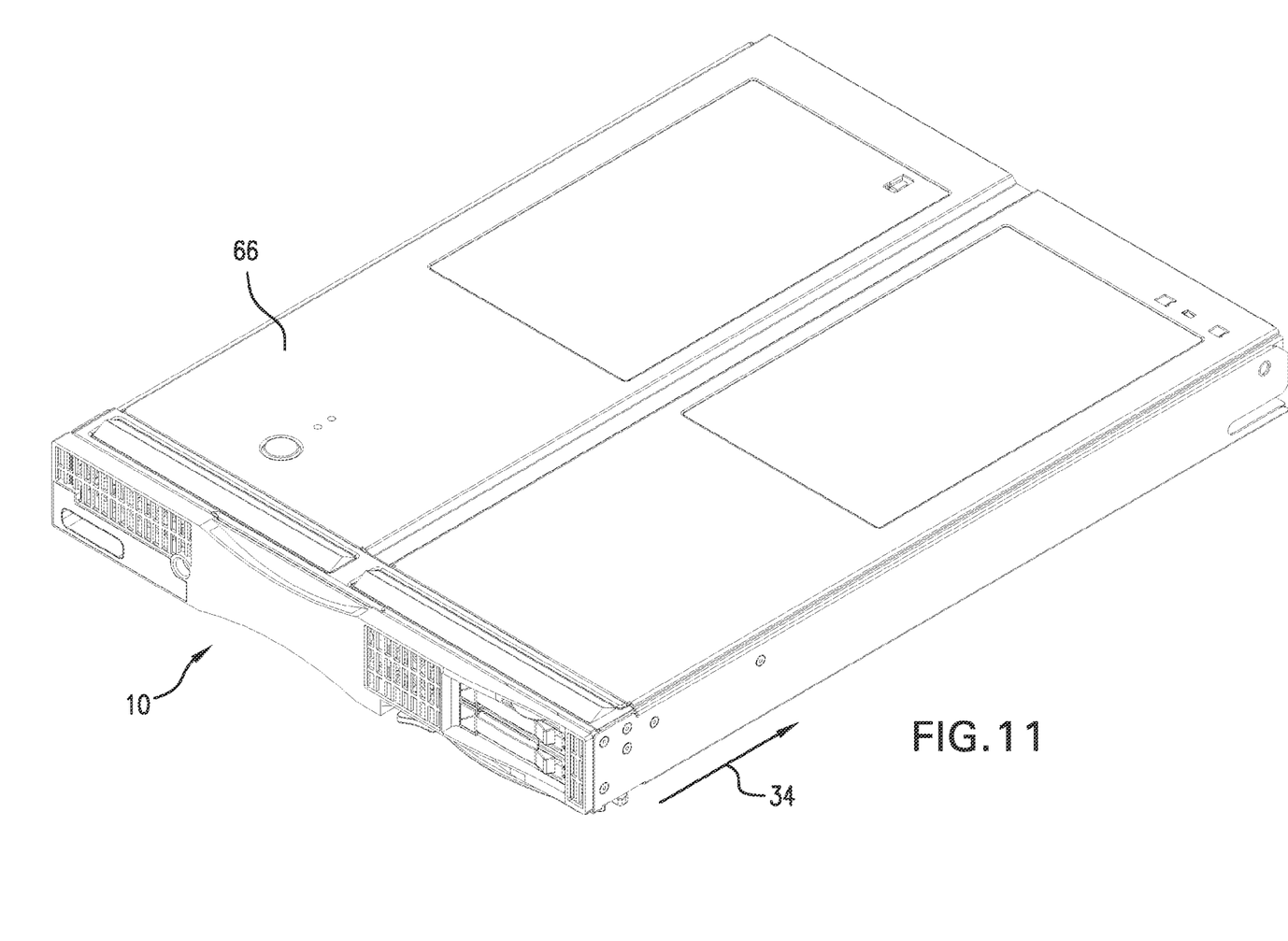
FIG. 11 is a perspective view of the computer system of FIG. 9 after a cover has been installed over the computer system, in accordance with embodiments of the present invention.

FIG. 11 is a perspective view showing computer system 10 after installation of cover 66. Cover 66 also provides an upper surface for the air channels, such as air channel 38 in FIG. 9. Accordingly, airflow along the direction shown by arrow 34 flows through the air channels and over the fins of the heatsinks, thereby cooling the memory modules.

In the embodiments described above, a pair of heatsinks and a spring are provided between each pair of closely adjacent memory modules. However, a heatsink is not provided on a side of a memory module that does not have a closely adjacent memory module. For example, in FIG. 9, a pair of heatsinks and a spring are provided between memory modules 16 and 18. However, the other side of memory module 16 is not provided with a heatsink. Since there is not another memory module positioned close to the other side of memory module 16, airflow passing over the heat spreader of the other side of memory module 16 is sufficient to cool the other side of memory module 16.

Embodiments of the present invention facilitate increased component density. By using embodiments of the present invention, adjacent memory modules may be positioned more closely, with heat generated by the memory modules removed by heatsinks and dissipated by heatsink fins in an air channel.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. An electronic device comprising:
   a circuit board;
   first and second memory modules coupled to the circuit board, wherein the first and second memory modules are adjacent and parallel to each other;
   a baffle positioned above the first and second memory modules, the baffle having an air channel, with a slot in the air channel parallel to a gap between the first and second memory modules;
   a first heatsink in thermal contact with the first memory module and extending through the slot into the air channel;
   a second heatsink in thermal contact with the second memory module and extending through the slot into the air channel; and
   a spring between the first and second heatsinks, the spring urging the first heatsink toward the first memory module and the second heatsink toward the second memory module.

2. The electronic device of claim 1 wherein the first and second heatsinks each comprise a vapor chamber having liquid provided therein.

3. The electronic device of claim 1 where the first and second heatsinks each have fins in the air channel.

4. The electronic device of claim 1 and further comprising thermal interface material between the first heatsink and the first memory module, and between the second heatsink and the second memory module.

5. The electronic device of claim 1 wherein the electronic device is housed in an enclosure, and airflow in the enclosure flows substantially parallel to, and through the air channel.

6. The electronic device of claim 5 and further comprising a cover attached to the enclosure, with the cover providing an upper surface for the air channel.

7. The electronic device of claim 1 wherein the spring includes a plurality of "S" shaped fingers.

8. A computer system comprising:
   an enclosure, wherein air flows through the enclosure along an airflow direction;
   a motherboard in the enclosure;
   one or more processors coupled to the motherboard;
   a plurality of pairs of adjacent and parallel memory modules coupled to the motherboard, wherein any memory module may be a member of more than one pair;
   a baffle positioned above the plurality of pairs of adjacent and parallel memory modules, the baffle including a plurality of air channels substantially parallel to the airflow direction, with each air channel having one or more slots over a gap between a pair of adjacent and parallel memory modules of the plurality of pairs of adjacent and parallel memory modules;
   a pair of heatsinks in each slot, with each heatsink having a memory side and a spring side, and a heat dissipating portion that remains above the slot; and
   a spring in each slot, with the spring making contact with the spring side of each heatsink of the pair of heatsinks to urge the memory side of each heatsink of the pair of heatsinks into thermal contact with a memory module of the plurality of pairs of adjacent and parallel memory modules.

9. The computer system of claim 8 wherein the heat dissipating portion of at least one heatsink comprises fins.

10. The computer system of claim 8 wherein at least one heatsink comprises a vapor chamber having liquid provided therein.

11. The computer system of claim 8 wherein at least one heatsink includes thermal interface material provided on the memory side.

12. The computer system of claim 8 and further comprising a cover attached to the enclosure, with the cover cooperating with the baffle to provide an upper surface for at least one of the air channel of the plurality of air channels.

13. The computer system of claim 8 wherein at least one spring includes a plurality of "S" shaped fingers.

14. An apparatus for cooling first and second adjacent components comprising:
   a baffle having a slot, wherein the slot is positioned between the first and second components when the baffle is installed above the components;
   a pair of heatsinks adapted to be inserted into the slot, with each heatsink having a heat dissipating portion that remains above the slot after insertion into the slot, and a component side and a spring side below the slot after insertion into the slot; and
   a spring adapted to be inserted into the slot between the pair of heatsinks.

15. The apparatus of claim 14 wherein the baffle includes an air channel, and the slot is positioned in the air channel.

16. The apparatus of claim 15 wherein the heat dissipating portion of each heatsink of the pair of heatsinks comprises fins positioned in the air channel.

17. The apparatus of claim 14 wherein each heatsink of the pair of heatsinks comprise a vapor chamber having liquid provided therein.

18. The apparatus of claim 14 wherein each heatsink of the pair of heatsinks has a lower beveled edge.

19. The apparatus of claim 14 wherein each heatsink of the pair of heatsinks includes thermal interface material provided on the component side.

20. The apparatus of claim 14 wherein the spring includes a plurality of "S" shaped fingers.

* * * * *